PROXIMITY SWITCH

Filed Nov. 23, 1966

TAKESI MIYAGAWA,
MASAYUKI OYAGI
INVENTORS

BY
Christensen, Sanborn & Matthews
ATTORNEYS

1

2

3,504,236

PROXIMITY SWITCH

Takesi Miyagawa and Masayuki Oyagi, Kyoto, Japan, assignors to Omron Tateisi Electronics Co., Kyoto, Japan, a company of Japan Filed Nov. 23, 1966, Ser. No. 596,621
Claims priority, application Japan, Nov. 23, 1965, 40/71,848
Int. Cl. H01h *47/12, 47/32*
U.S. Cl. 317—146 4 Claims

ABSTRACT OF THE DISCLOSURE

A proximity detector which has a proximity sensing circuit coupled with the tank circuit of an oscillator and tuned for series resonance so that the effective capacitance of the cable connecting the sensor to the oscillator unit does not affect the resonant frequency. Thus the circuit constants need not be adjusted when different lengths of cable are used to connect the remote sensor to the oscillator.

This invention relates to improvements in a proximity detector of the type that comprises a high frequency oscillator including a tank circuit, the inductance or capacitance of which is used as a pickup for sensing the approach of an object thereto.

Such type of proximity detectors are well known, wherein as an object approaches the pickup, its inductance or capacitance changes so as to change the oscillating condition of the oscillator, thereby stopping or starting the oscillation thereof. This change in the output condition of the oscillator is used as a test by which to detect the presence or absence of an object within the field of the pickup.

In recent years, such proximity detectors are transistorized. If they are used under relatively high temperature conditions, they will not work well since transistors are rather sensitive to ambient temperature changes. To avoid this, it would be necessary to separate the pickup or sensor from the other component parts of the detector and connect them with a considerable length of cable to bring the pickup far from the detector body. In this case, however, the capacitance, inductance and resistance of the connecting cable must be taken into account in presetting the various constants of the circuit to provide a desired operating condition for the oscillator. However, once the circuit constants have been determined, any change in the length of the cable connecting the sensor to the oscillator unit use of the proximity detector, will certainly necessitate a corresponding change in the circuit constants of the oscillator. Otherwise, the proximity detector would not function properly. Certainly, it is very troublesome and uneconomical to change the circuit constants upon every change in the length of the connecting cable.

Accordingly, it is one object of the invention to provide a proximity detector which is provided with a pickup unit connected by a length of cable to the other component parts, and in which even when the length of the connecting cable has been changed, the proper operation of the detector is still assured without any corresponding change in the circuit constants.

Another object of the invention is to provide a proximity detector which comprises a high frequency oscillating circuit provided with a particular tuned circuit, the inductance coil of which is used as a pickup.

A further object of the invention is to provide a proximity detector which comprises a high frequency oscillating circuit provided with a particular tuned circuit, one electrode of the condenser of which is used as a pickup.

The proximity detector of the present invention comprises a high frequency oscillator provided with a particular tuned circuit. The tuned circuit comprises a series combination of a first inductance coil and a first condenser, the coil being electromagnetically coupled with an inductance coil of the oscillator; and another series combination of a second inductance coil and a second condenser, with a length of cable connecting the first and second series circuits. Either the second inductance coil or one electrode of the second condenser is used as a sensor. In accordance with the invention, the inductances and capacitances are selected such that the tuned circuit is tuned to the oscillating frequency.

In the following description, however, it is first assumed that the connecting cable is sufficiently shorter than the wavelength of the oscillating output so that the cable circuit may be considered as a concentrated constant circuit. The connecting cable has a capacitance and resistance, which must be given consideration.

Due to the capacitance of the cable, the tuned circuit of the invention may equivalently be considered as comprising a parallel combination of the cable capacitance and the second series inductance and capacitance, and the first series inductance and capacitance connected in series with the parallel combination. Then the circuit has two series-resonant frequencies and a single parallel-resonant frequency therebetween. By selecting the first and second coils of equal inductance values and at the same time the first and second condensers of equal capacitance values, as previously mentioned, it is possible to render the lower of the two series-resonant frequencies independent from the cable capacitance. Therefore, the problem of the cable capacitance can be solved by setting the oscillating frequency to substantially the same value as the lower tuned frequency.

It is impossible to neglect the resistance that the connecting cable has. However, by connecting a resistor of a greater resistance value than that of the cable in series with the first inductance coil, the influence of the cable resistance can be reduced to minimum.

The invention will be better understood from the following description of preferred embodiments thereof with reference to the accompanying drawings, wherein like reference numerals denote like parts and wherein.

Figure 1:
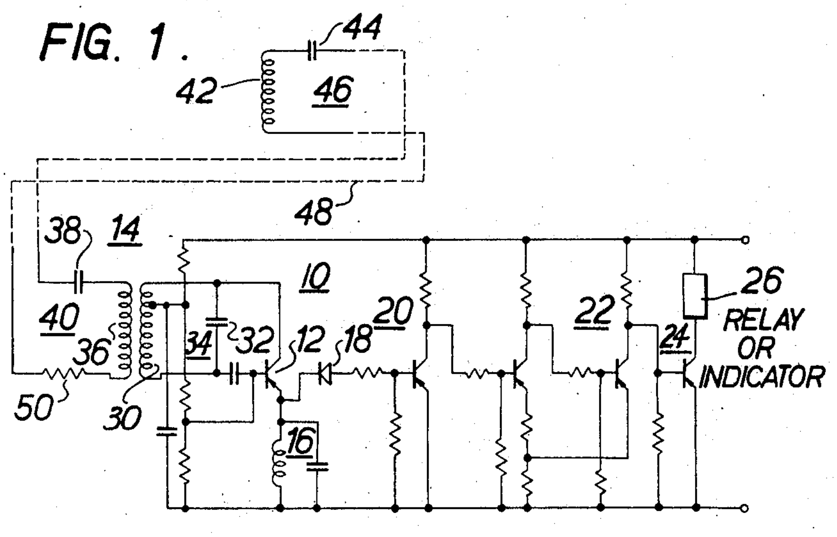
FIG. 1 is a circuit diagram of one embodiment of the invention.

Referring in detail to the drawings, first to FIG. 1, there is shown a well known Hartley oscillator 10, which comprises a transistor 12, a tank circuit 34 connected between the collector and base of the transistor 12 and a resonant circuit 16 connected between the base and emitter of the transistor. In accordance with the present invention a particular tuned circuit 14 is electromagnetically coupled with the tank circuit 34. So long as the tuned frequency of the circuit 14 differs from the oscillating frequency, the oscillator can maintain its oscillation.

However, when the tuned frequency changes to become substantially equal to the oscillating frequency, the oscillation stops. Therefore, if the whole circuit is so arranged that when there is no object in the field of the sensor or pickup, the tuned frequency of the circuit 14 differs from the oscillating frequency, and that as an object approaches the sensor, the tuned frequency changes until it becomes substantially equal to the oscillating frequency, then the oscillator maintains its oscillation in the absence of an object within the sensor field and stops its oscillation upon entrance of an object into the field. On the contrary, if the arrangement is such that the tuned frequency is substantially equal to the oscillating frequency in the absence of an object within the field of the sensor, and that upon entrance of an object into the field, the tuned frequency becomes different from the oscillating frequency, then the oscillator is not oscillating in the absence of an object within the field of the sensor but starts its oscillation upon entrance of an object into the sensor field. These two types of operation may be called "an oscillation stopping type" and "an oscillation starting type," respectively. In either of the two types, by the change in the output condition of the oscillator, it is possible to detect the presence or absence of an object in the field of the sensor. It is assumed that the illustrated embodiments are of "an oscillation starting type."

Any suitable means may be used to detect the output change of the oscillator. Here, the emitter of the transistor 12 of the oscillator is connected to an amplifier 20 through a diode 18. The amplified output is applied to a wave-shaping Schmitt circuit 22 and thence to a second amplifier 24, the output of which is applied to a relay 26. From the operation of the relay may be derived an indication of the presence or absence of an object in the field of the sensor.

The tank circuit 34 of the oscillator 10 comprises a parallel combination of an inductance coil 30 and a condenser 32. The tuned circuit 14 comprises a series combination 40 of a first condenser 38 and a first inductance coil 36 which latter is electromagnetically coupled with the coil 30 of the tank circuit 34, another series combination 46 of a second inductance coil 42 and a second condenser 44, and a length of cable 48 connecting the two series circuits 40 and 46. The second inductance coil 42 is used as a sensor or pickup. Alternatively, one electrode of the second condenser 44 may be utilized for the same purpose as will be described later. In order to eliminate the adverse influence of the resistance that the cable 48 has, a resistor 50 is connected in series with the first inductance coil 36. This resistor has a greater resistance value than that of the cable 48.

As previously mentioned, the first and second coils 36 and 42 are selected of the same inductance value, and the first and second condensers 38 and 44 are also selected of the same capacitance value. The connecting cable 48 may be selected of any suitable length so long as it is considerably shorter than the wavelength of the oscillating output. The tuned circuit 14 is so designed that the tuned frequency is substantially equal to the oscillating frequency when there is no object in the field of the sensor coil 42.

Suppose that an object has entered the field of the sensor coil, and the apparent inductance thereof will decrease. This will cause the impedance of the tuned circuit to change until the tuned frequency becomes different from the oscillating frequency, whereupon oscillation is started in the oscillator. This change in the output condition of the oscillator is recognized by the operation of the relay 26.

Figure 3:
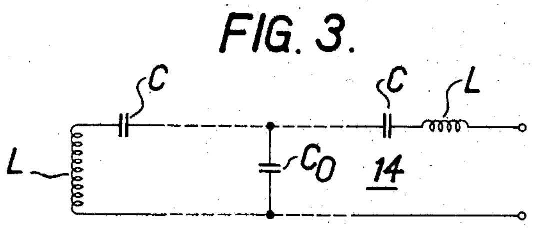
FIG. 3 is an equivalent circuit of the tuned circuit of the invention for illustration of the principle of the invention.

Even when the cable 48 is of such a length as not to constitute a distributed constant circuit at the oscillating frequency, and the inductance and resistance of the cable are negligible, yet its capacitance cannot be neglected as previously mentioned. However, so long as the closed loop consisting of inductances 36 and 42 and capacitors 38 and 44 form a series circuit, then the capacitance of the cable can be neglected. In order to prove this, FIG. 3 illustrates an equivalent circuit of the tuned circuit 14. Here, the inductances of the two coils 36 and 42 are both expressed by L; the capacitances of the two condensers 38 and 44, by C; and the capacitance of the cable 48, by $C_0$. As shown, the series combination of the second inductance coil and condenser is connected in parallel with the capacitance of the cable, and the parallel combination is connected in series with the series combination of the first inductance coil and condenser. Such a circuit has two series-resonant frequencies and a single parallel-resonant frequency.

In order to obtain the series-resonant frequencies, the impedance of the circuit is first calculated. Then, let the condition under which the impedance becomes zero be applied to the calculation, and the two series-resonant frequencies will be $$f_1=\frac{1}{\sqrt{LC}} \text{ and } f_2=\sqrt{\frac{1}{LC}+\frac{1}{LCo}}$$

Since the lower frequency $f_1$ does not include the capacitance $C_0$ of the cable, it is always determined by C and L. In other words, the frequency $f_1$ is not influenced by the change in length of the cable and, consequently, in the capacitance $C_0$ thereof. Therefore, by setting the oscillating frequency to the lower frequency $f_1$, the problem of the cable capacitance can be solved.

Figure 2:
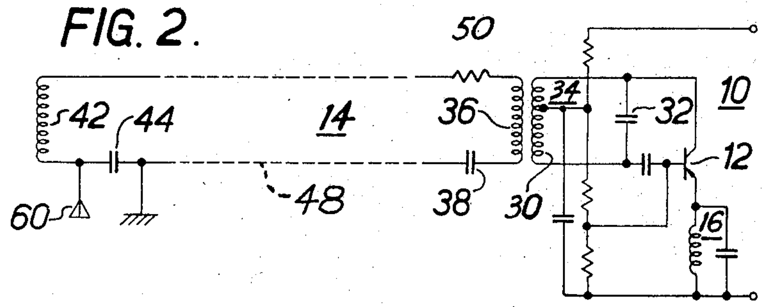
FIG. 2 is a circuit diagram of another embodiment of the invention.

In FIG. 1, the inductance change of the sensor coil 42 is utilized to detect the approach of an object thereto. Capacitance change may also be relied on for the same purpose. FIG. 2 shows, by way of example, such an arrangement, wherein the second condenser 44 has its one terminal grounded and the other terminal connected to an antenna 60. The capacitance of the antenna relative to ground will thus be connected in parallel with the condenser 44. Any object which comes in between the antenna and ground will change the capacitance of the antenna and, consequently, the impedance of the tuned circuit 14. Thereafter, the operation of the detector is substantially the same as that of FIG. 1, so that no further description thereof will be necessary.

What we claim is:

1. A proximity detector comprising:
an oscillator including
a tank circuit having an inductance coil;
a tuned series-resonant proximity sensing circuit including
a first series combination of
a first condenser and
a first inductance coil electromagnetically coupling said sensing circuit to the tank circuit inductance coil,
a second series combination of
a second condenser and
a second inductance coil
forming a sensor unit adapted to be placed remote from said oscillator and having a different reactance value when there is an object in the field thereabout from that when there is no object in said field, and
a two-conductor cable
connecting said first and second series combinations in a series loop
with any effective capacitance between the conductors of said cable being connected across said loop in parallel with said series combinations; and
means coupled with said oscillator for detecting the output condition thereof.

2. The proximity detector defined in claim 1, wherein a resistor of a greater resistance value than that of said connecting cable is connected in series with said sensor unit.

3. The proximity detector defined in claim 1, wherein the inductance of said sensor unit has a different value when there is an object in the field of said senor unit from that when there is no object therein.

4. The proximity detector defined in claim 1, wherein the capacitance of said sensor unit has a different value when there is an object in the field of said sensor unit from that when there is no object therein.

References Cited

UNITED STATES PATENTS

| | | | |
|---|---|---|---|
| 2,267,445 | 12/1941 | Cork et al. | 333—33 |
| 2,492,388 | 12/1949 | Martin | 340—258 XR |
| 2,573,172 | 10/1951 | Ennis et al. | 317—146 XR |
| 2,708,746 | 5/1955 | Shaw | 317—146 XR |
| 2,768,355 | 10/1956 | Nebel | 333—23 XR |
| 2,963,627 | 12/1960 | Buchsbaum | 317—149 |
| 3,147,408 | 9/1964 | Yamamoto et al. | 317—148.5 XR |
| 3,201,774 | 8/1965 | Vermura | 340—258 |
| 3,248,691 | 4/1966 | Kirk | 340—258 XR |
| 3,292,052 | 12/1966 | Richter et al. | 317—148.5 |

LEE T. HIX, Primary Examiner

W. M. SHOOP, Jr., Assistant Examiner

U.S. Cl. X.R.

317—148.5; 333—32; 340—258